US006350140B1

United States Patent
Gallagher et al.

(10) Patent No.: US 6,350,140 B1
(45) Date of Patent: *Feb. 26, 2002

(54) I/O ADAPTER CARD MOUNTING PLATE

(75) Inventors: Brian Gallagher, Marlboro; Jeffrey Teachout, Upton, both of MA (US)

(73) Assignee: EMC Corporation, Hopkinton, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/884,739

(22) Filed: Jun. 30, 1997

(51) Int. Cl.[7] .............................................. H01R 13/62
(52) U.S. Cl. ....................................... 439/327; 361/801
(58) Field of Search ......................... 439/61, 355, 327; 361/801, 686; 211/41.17

(56) References Cited

U.S. PATENT DOCUMENTS

| | | | | |
|---|---|---|---|---|
| 5,317,483 A | * | 5/1994 | Swindler | 361/801 |
| 5,694,291 A | * | 12/1997 | Feightner | 361/801 |
| 5,757,618 A | * | 5/1998 | Lee | 361/801 |
| 5,936,835 A | * | 8/1999 | Astier | 361/683 |
| 5,967,466 A | * | 10/1999 | Osborne et al. | 361/726 |
| 5,982,627 A | * | 11/1999 | Haughton | 361/801 |
| 5,991,983 A | * | 11/1999 | Kohler et al. | 361/807 |
| RE36,695 E | * | 5/2000 | Holt | 439/327 |
| 6,069,796 A | * | 5/2000 | Hastings et al. | 439/327 |
| 6,138,839 A | * | 10/2000 | Cranston, III et al. | 211/41.17 |
| 6,182,835 B1 | * | 2/2001 | Chen | 211/41.17 |
| 6,215,673 B1 | * | 4/2001 | Gordon et al. | 211/41.17 |
| 6,276,041 B1 | * | 8/2001 | Boe | 361/740 |

* cited by examiner

*Primary Examiner*—Neil Abrams
(74) *Attorney, Agent, or Firm*—Daly, Crowley & Mofford, LLP

(57) ABSTRACT

Apparatus for securing an array of I/O adapter cards to a case, each one of the I/O adapter cards having mounted thereto a mounting bracket having a screw receiving hole and being adapted to be plugged into a motherboard. The apparatus includes an I/O adapter card mounting plate having captive fastening hardware and tips. The plate is adapted to be placed over the mounting bracket as a single piece. The captive hardware is adapted to pass through a first set of screw receiving holes and tips to be inserted into another set of screw receiving holes. The captive hardware is adapted to enable manual fastening of the mounting member to secure the mounting bracket between the mounting plate and the case after the array of I/O adapter cards has been plugged into the motherboard. Each one of the cards has mounted thereto an L-shaped mounting bracket, such bracket having a screw receiving hole therein. The plate is adapted to be placed over a foot of L-shaped brackets as a single piece. The captive hardware is adapted to pass into the screw receiving holes of one set of the cards to enable manual fastening of the case to secure the array of printed circuit board.

3 Claims, 5 Drawing Sheets

I/O ADAPTER CARD MOUNTING PLATE

BACKGROUND OF THE INVENTION

This invention relates generally to data servers and more particularly to data servers adapted to move data between a network and a data storage system. As is known in the art, data servers are used to move data between a storage system, such as between a Symmetrix Integrated Cached Disk Array storage system and a network. The data server typically includes a set AC powered processing unit modules each of which includes a central processing unit (CPU), input/output (I/O) adapter cards, and a main memory programmed to run a variety of software application programs for subscribers to the network. These applications include file access, video access and/or network backup. In one such data server, a set of five, AC powered, personal computers (PCs) are packaged inside a standard 19 inch cabinet. The five PCs are connected together via a twisted pair cable to an Ethernet hub. A laptop PC is used as a control station for the other PCs. A keyboard/monitor multiplexer (mux) was used to pass each PC's boot sequence with a single keyboard and monitor.

SUMMARY OF THE INVENTION

In accordance with the invention, an I/O adapter card mounting plate is provided for securing an array of I/O adapter cards to a case. Each one of the I/O adapter cards has mounted thereto a mounting bracket. A motherboard is disposed in the case and is adapted to have plugged therein the array of I/O adapter cards. The mounting plate has captive fastening hardware and is adapted to be placed over the mounting bracket as a single piece. The captive hardware is adapted to enable manual fastening of the mounting member to secure the mounting bracket between the mounting plate and the case after the array of I/O adapter cards has been plugged into the motherboard.

BRIEF DESCRIPTION OF THE DRAWINGS

Other features of the invention, as well as the invention itself, will become more readily apparent from the following detailed description taken together with the accompanying drawings, in which:

FIG. 2A is a sketch of an array of such I/O adapter cards; FIG. 2B is an exploded cross-sectional diagrammatical sketch showing the arrangement between the mounting plate, an I/O adapted card and a mounting member provided on a front bezel of a module; and FIG. 2C is an isometric, exploded drawing of the I/O adapter plate mounting member according to the invention.

DESCRIPTION OF THE PREFERRED EMBODIMENTS

Figure 1A:
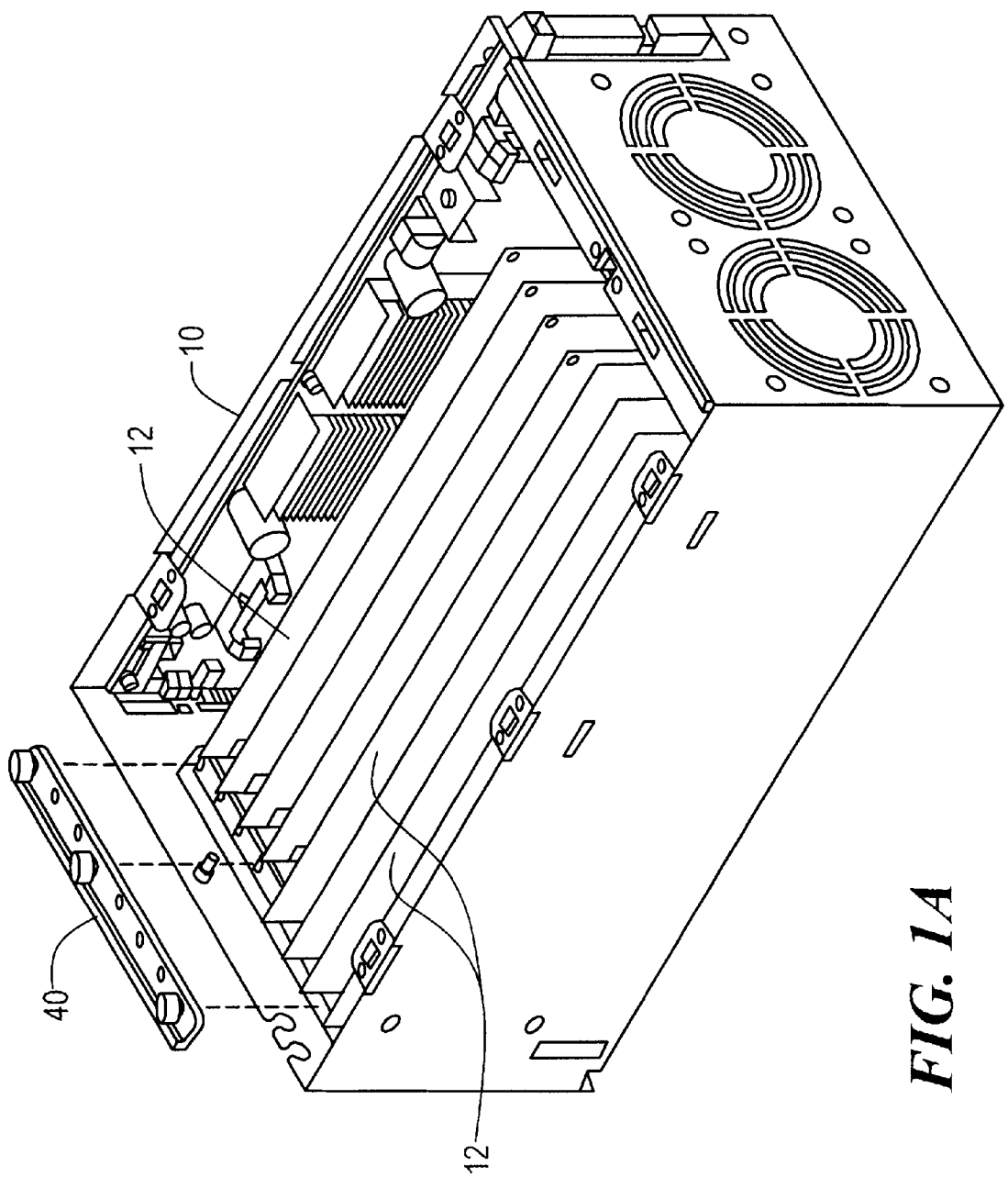
FIGS. 1A and 1B are drawings of a processing unit module.
Figure 1B:
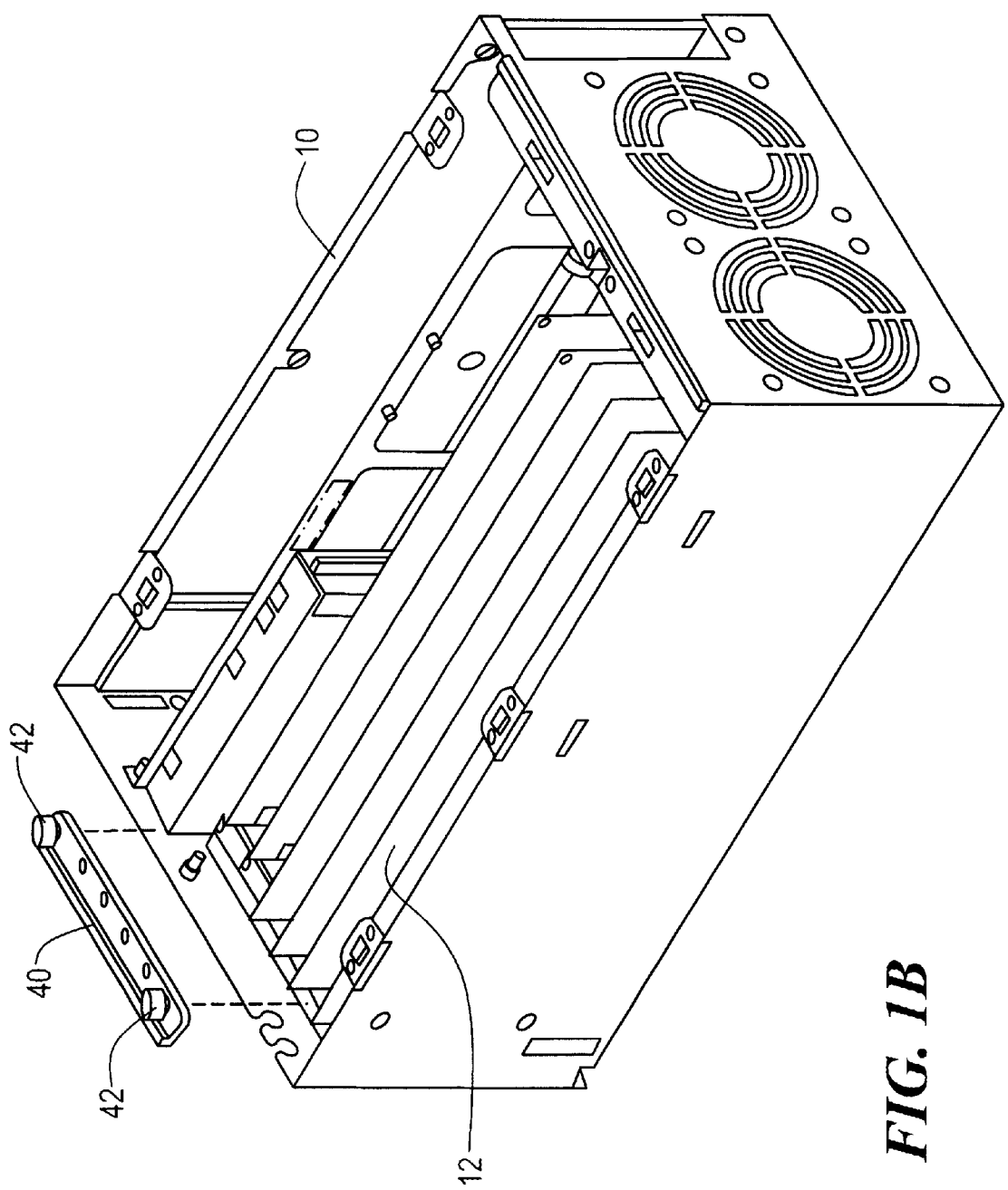

Referring now to FIGS. 1A and 1B, a processing unit module 10 is shown. Such module 10 includes a motherboard (not shown) positioned on the bottom of the module having plugged therein I/O adapter cards 12. It is noted that the processing unit module 28 is configured to enable use of market available processing unit module motherboards and I/O adapter cards 12.

Figure 2A:
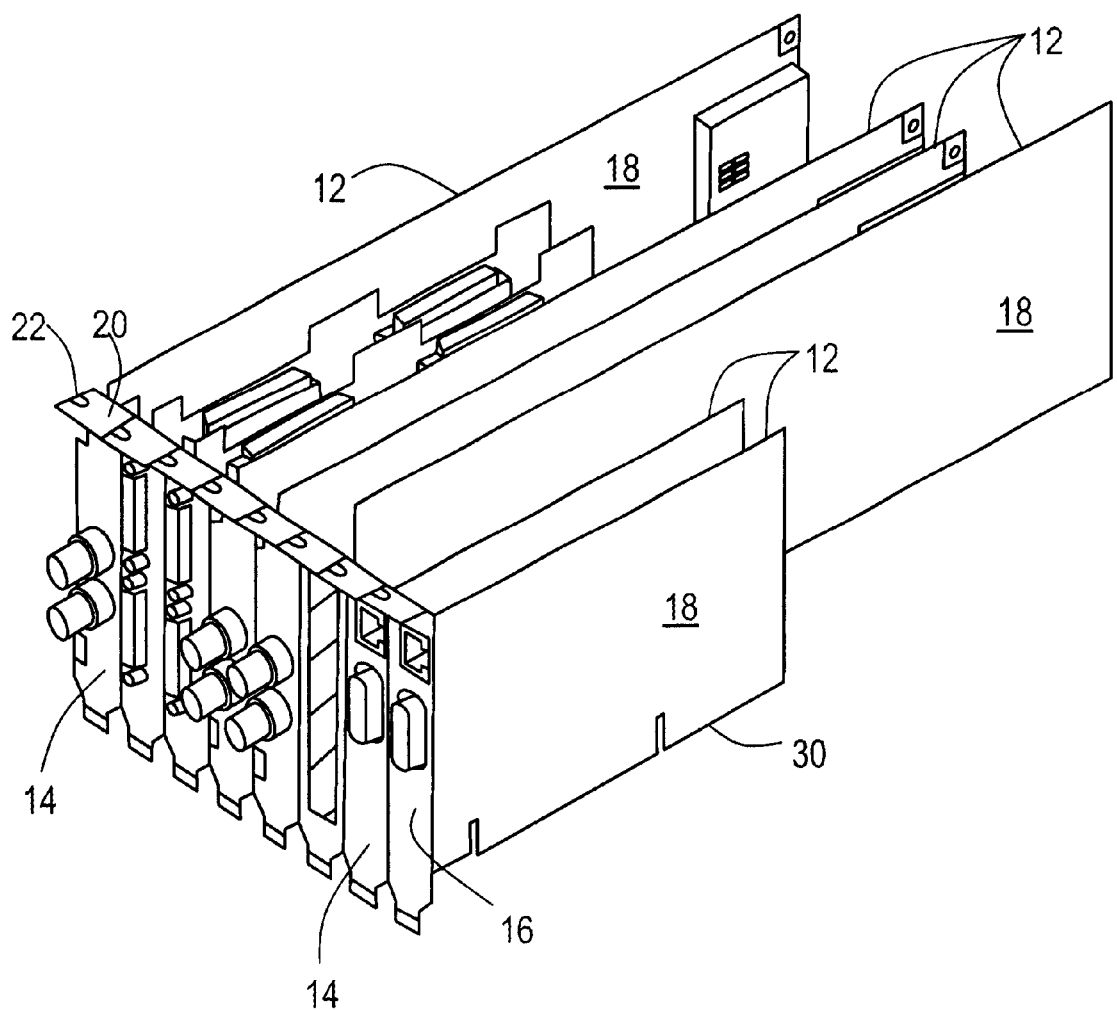
FIGS. 2A–2C are drawings used to illustrate an I/O adapter card mounting plate according to the invention.

An exemplary array of I/O adapter cards 12 is shown in FIG. 2A. It is noted that the I/O cards 12 are off-the-shelf printed circuit boards having an L-shaped mounting bracket 14. Each one of the L-shaped mounting brackets 14 has a leg portion 16 fastened to a printed circuit board, or card 18 and a foot portion 20 with a U-shaped opening 22 passing through the foot portion 20 normally used to receive a screw, not shown, used to securing the bracket 14 to a mounting member 26 (FIG. 2B) of the module 10, for example. The L-shaped mounting bracket 14 is, noted above, affixed to a printed circuit card 18. The printed circuit card 18 is adapted to have its bottom edge 30 plug into one of the slots, not shown, in the motherboard, not shown. After the printed circuit card 18 is plugged into the motherboard, rather then securing the L-shaped mounting bracket 14 to the mounting member 26 with individual screws, a mounting plate 40 having a plurality of captive screws 42 (FIG. 2C) is used.

Figure 2B:
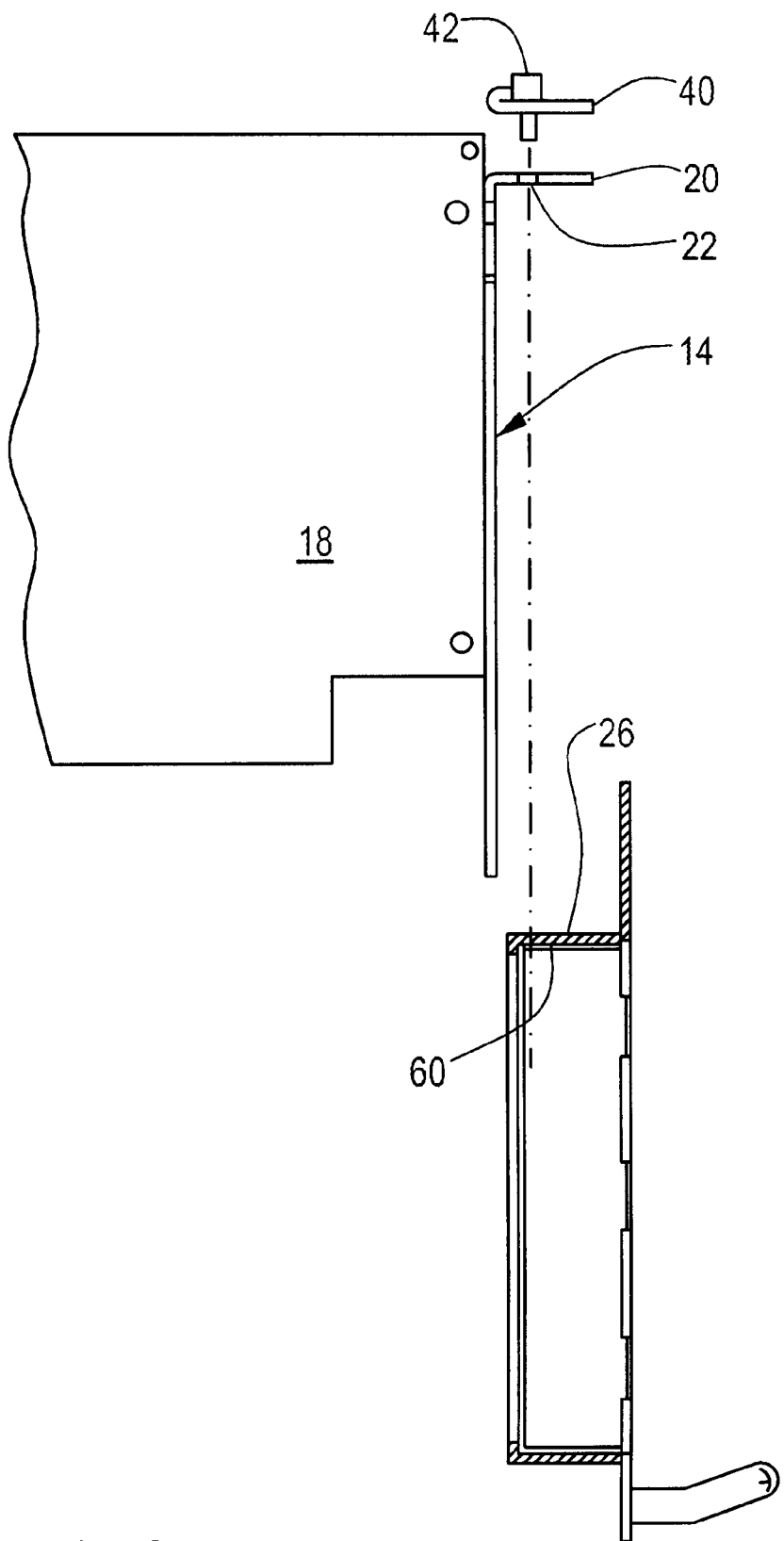
Figure 2C:
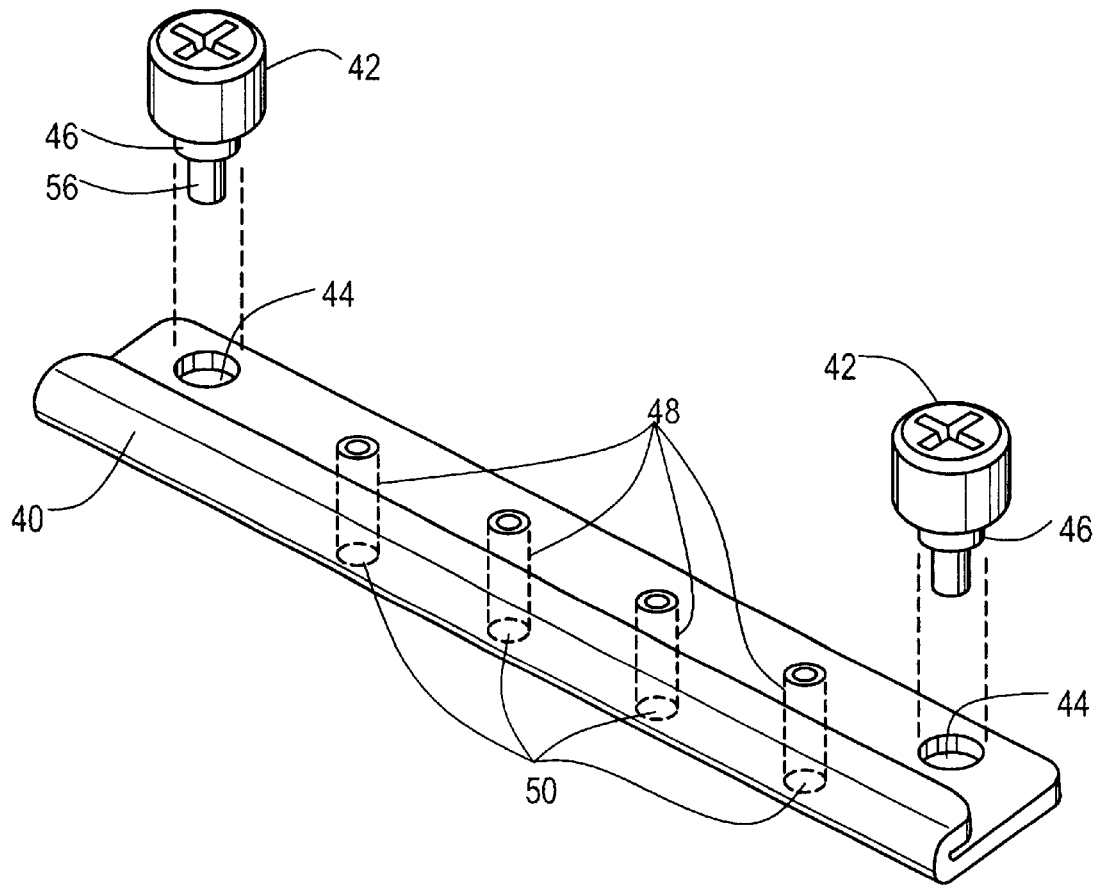

More particularly, and referring also to FIGS. 1A and 1B, the mounting plate 42 has press fit into a plurality of holes 44 (FIG. 2C) formed therein a corresponding plurality of screw fixtures 46, here manufactured by Penn Engineering and Manufacturing Company, Danboro, Penn. 18916, and a plurality of press fit pins 48 having tips 50 which project from the bottom of the plate 42 as a single unit to engage the U-shaped openings 22 in place of individual screws. The screw fixtures 46 have an outer collar which is press-fit into the holes 44 in the mounting plate 40 to thereby secure the screw fixtures 46 to the mounting plate 40 as a single unit. The screws 40 are rotatably mounted within the screw fixtures 46. The distal ends 56 of the screws 42, and, as described above, the tips 50 of pins 48, project outwardly from the bottom of the mounting plate 40. After one, or more, of the printed circuit boards 18 are plugged into the motherboard, not shown, the bottom of the mounting plate 50 is set over the horizontal foot portion 20 of the L-shaped mounting brackets 14, as shown in FIG. 2B. The technician, using his/her thumb and forefinger about the outer periphery of the screws 42, turns the screws 42 within the fixture 46 clockwise to screw the screws 42 into the corresponding, tapped and threaded holes 60 provided in the mounting member 26 thereby mounting the entire mounting plate 40 to the mounting member 26. Thus, the mounting plate 40, when secured to the mounting member 26, fastens the L-shaped brackets 14 to such mounting member 26. Conversely, to remove one or more I/O adapter cards 12, the technician turns the screws 42 counter-clockwise until the mounting plate 40 is released from the mounting member 26. The technician then lifts and removes the mounting plate 40. Once the mounting plate 40 is removed, the technician unplugs the desired I/O adapter card or cards 12. As noted above, the screws are captive to the mounting plate 40 (i.e, the screws 42 in their fixtures 46 are captive hardware to the mounting plate 40). Further, the mounting plate 40 is a relatively large piece. Therefore, instead of having to contend with six or eight individual screws, which are relatively small, difficult to handle individually, and subject to being dropped and difficult to retrieve, the single, relatively large mounting plate with captive hardware greatly facilitates the insertion and/or removal of the I/O adapter cards 12. Still further, a screw driver is not required.

Other embodiments of the invention are within the spirit and scope of the appended

What is claimed is:

1. Apparatus for securing an array of I/O adapter cards to a case, each one of the I/O adapter cards having mounted thereto a mounting bracket having a screw receiving hole and being adapted to be plugged into a motherboard, comprising:

an I/O adapter card mounting plate having captive fastening hardware and tips, such plate being adapted to be placed over the mounting brackets of the array of I/O adapter cards as a single piece, the captive hardware being adapted to pass through a first set of the screw receiving holes of the mounting brackets and the tips to be inserted into another set of the screw receiving holes of the mounting brackets, such captive hardware being adapted to enable manual fastening of the mounting member plate to the case to secure the mounting brackets between the mounting plate and the case after the array of I/O adapter cards has been plugged into the motherboard.

2. A system adapted for securing an array of printed circuit board cards to a case, each one of the cards having mounted thereto a mounting bracket having a screw receiving hole and adapted to be plugged into a printed circuit board, comprising:

a mounting plate, such mounting plate having captive fastening hardware adapted to pass through a first set of the screw receiving holes of the mounting brackets of the array of I/O adapter cards and such mounting plate having tips adapted to be inserted into another set of the screw receiving holes of the mounting brackets of the array of I/O adapter cards, such mounting plate being adapted to secure the array of cards to the case when such hardware is secured to the case.

3. A printed circuit board mounting plate for securing an array of printed circuit board cards to a case, each one of the cards has mounted thereto an L-shaped mounting bracket, such bracket having a screw receiving hole therein, such card being adapted to be plugged into a motherboard disposed in the case, comprising:

a plate;

captive fastening hardware fastened to the plate;

a plurality of tips mounted to, and extending from a surface of the plate; and wherein the plate is adapted to be placed over a foot of L-shaped brackets as a single piece; and wherein the captive hardware is adapted to pass into the screw receiving holes of the mounting brackets of one set of the cards to enable manual fastening of the mounting plate to the case to secure the array of printed circuit board cards to the case after the array of cards have been plugged into the motherboard and to enable the tips to pass into the screw receiving holes of the mounting brackets of another set of the cards.

* * * * *